United States Patent
Eser et al.

(10) Patent No.: US 6,562,405 B2
(45) Date of Patent: May 13, 2003

(54) MULTIPLE-NOZZLE THERMAL EVAPORATION SOURCE

(75) Inventors: Erten Eser, Newark, DE (US); Gregory M. Hanket, Newark, DE (US)

(73) Assignee: University of Delaware, Newark, DE (US)

( * ) Notice: Subject to any disclaimer, the term of this patent is extended or adjusted under 35 U.S.C. 154(b) by 0 days.

(21) Appl. No.: 10/234,604

(22) Filed: Sep. 4, 2002

(65) Prior Publication Data

US 2003/0054100 A1 Mar. 20, 2003

Related U.S. Application Data

(60) Provisional application No. 60/322,039, filed on Sep. 14, 2001.

(51) Int. Cl.$^7$ .............................................. C23C 14/00
(52) U.S. Cl. ............................. 427/255.5; 427/255.395; 427/255.7; 118/718; 118/726; 392/388; 392/389
(58) Field of Search ............................. 118/718, 726; 427/255.395, 255.5, 255.7; 392/388, 389

(56) References Cited

U.S. PATENT DOCUMENTS

| | | | | | |
|---|---|---|---|---|---|
| 4,146,774 A | * | 3/1979 | Fraas | ......................... | 392/388 |
| 4,325,986 A | * | 4/1982 | Baron et al. | .................. | 438/62 |
| 4,392,451 A | * | 7/1983 | Mickelsen et al. | .......... | 118/690 |
| 5,532,102 A | * | 7/1996 | Soden et al. | ................ | 430/128 |
| 6,202,591 B1 | * | 3/2001 | Witzman et al. | ...... | 118/723 VE |

* cited by examiner

*Primary Examiner*—Richard Bueker
(74) *Attorney, Agent, or Firm*—Connolly Bove Lodge & Hutz

(57) ABSTRACT

A multiple nozzle thermal evaporation source includes a plurality of nozzles having a tapered shape. The nozzles may be coated with a thermally conductive material with a low emissivity material.

18 Claims, 2 Drawing Sheets

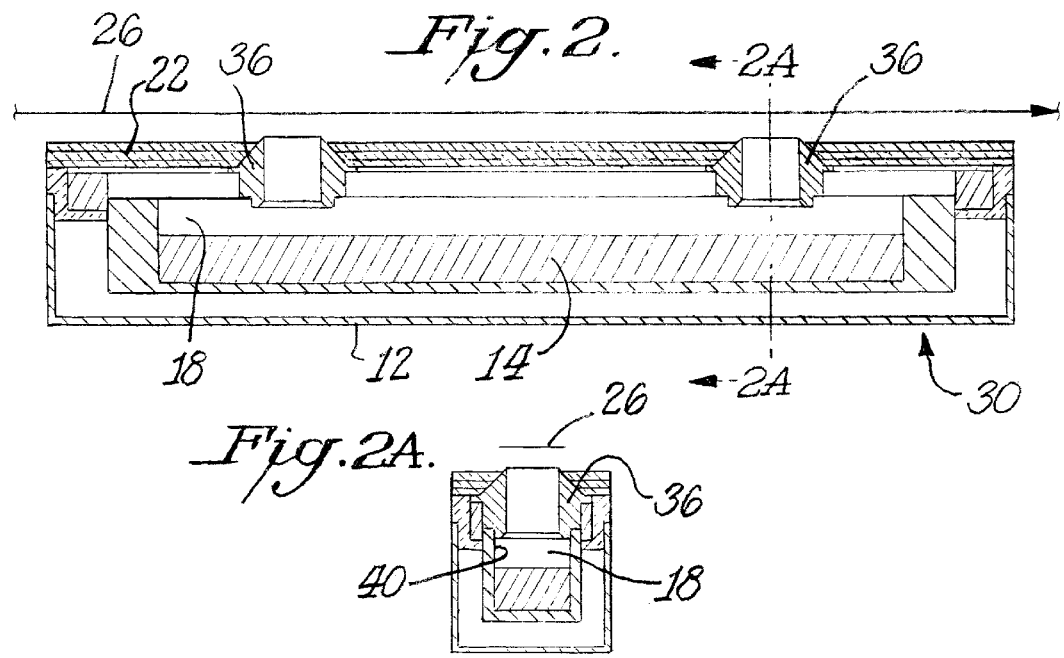
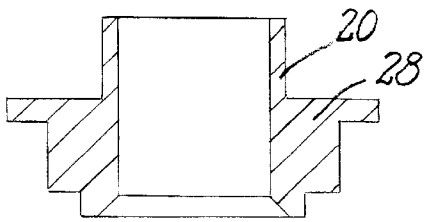
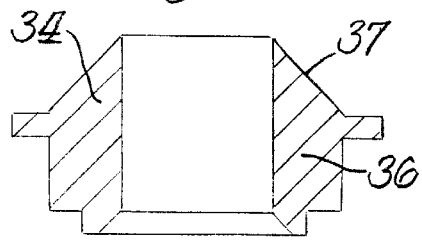
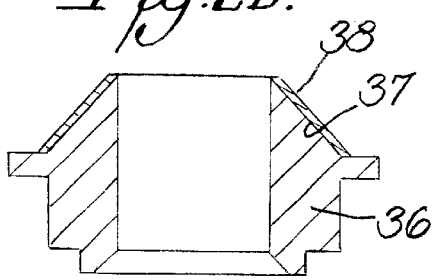
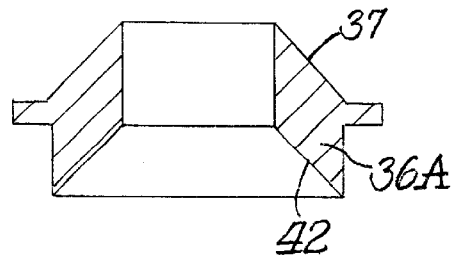

MULTIPLE-NOZZLE THERMAL EVAPORATION SOURCE

CROSS-REFERENCE TO RELATED APPLICATION

This application is based upon provisional application Serial No. 60/322,039, filed Sep. 14, 2001.

BACKGROUND OF THE INVENTION

The invention relates to deposition techniques involving thermal evaporation. In general, such techniques are used, for example, in the production of thin-film solar cells which requires large-area deposition techniques. Known techniques include roll coating by thermal evaporation in which a semiconductor film is deposited on a wide flexible substrate continuously drawn over an array of thermal evaporation sources. These sources require a significant quantity of heat shielding. The only elements of the source not covered by such heat shielding are the effusion nozzles wherein the nozzle tip extends beyond the outermost surface of the heat shielding.

U.S. Pat. No. 4,325,986 discloses work by others in this field.

SUMMARY OF THE INVENTION

An object of this invention is to provide improved structure for multiple-nozzle thermal evaporation sources.

In accordance with this invention the multiple-nozzle thermal evaporation source includes structure for improving the equilibrium within the source and for obtaining uniform effusion.

THE DRAWINGS

FIG. 2 is a view similar to FIG. 1 of a multiple nozzle evaporation source in accordance with this invention;

FIG. 2A is a cross-sectional view taken through FIG. 2 along the line 2A—2A;

FIG. 2B is a cross-sectional view of a prior art nozzle of the type shown in FIG. 1; and FIGS. 2C–2E illustrate in cross-section three nozzle shapes in accordance with this invention.

DETAILED DESCRIPTION

The present invention relates to improvements in multiple nozzle thermal evaporation source techniques. A known approach is described in U.S. Pat. No. 4,325,986, all of the details of which are incorporated herein by reference thereto.

Figure 1:
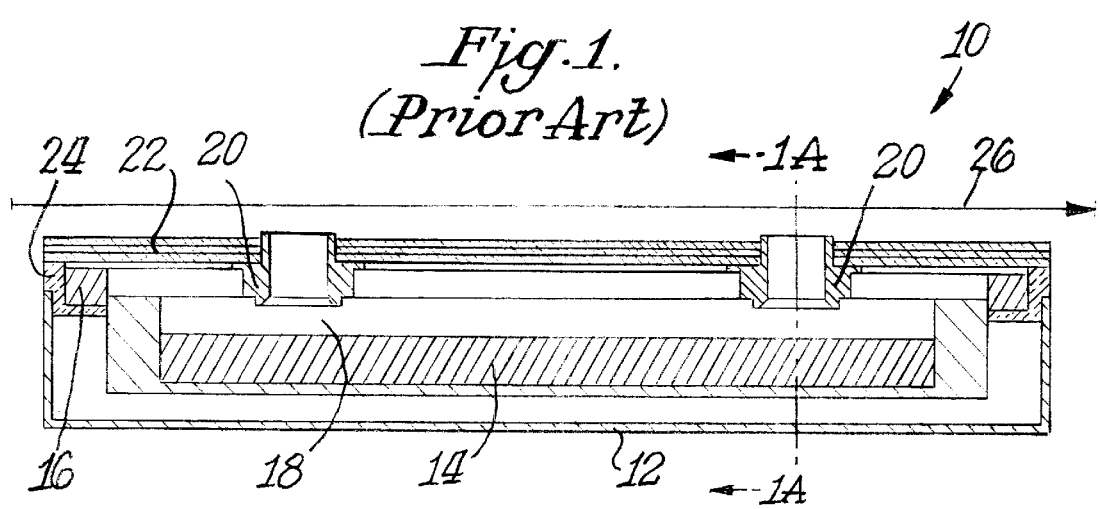
FIG. 1 illustrates a longitudinal section of a prior art multiple nozzle thermal evaporation source.
Figure 1A:
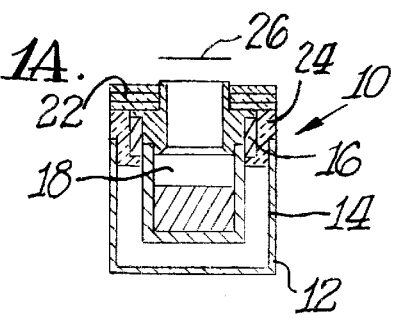
FIG. 1A is a cross-sectional view taken through FIG. 1 along the line A—A.

FIGS. 1 and 1A illustrate a prior art multiple nozzle thermal evaporation source 10 which includes a containment box 12 in which is located an evaporation chamber 18 containing a deposition source 14. Suitable heating structure 16 is also provided in containment box 12. The deposition source 14 is located below nozzles 20 which extend through suitable heat shielding 22. Containment box 12 is also provided with suitable insulation 24. A continuous semiconductor film substrate 26 passes over the nozzles 20.

FIG. 2 shows a multiple nozzle thermal evaporation source 30 in accordance with this invention. Source 30 contains many of the same components as the prior art source shown in FIG. 10. Accordingly, like numerals are used for like parts.

In general the present invention has the following characteristics.

The invention (evaporation source) 30 is an apparatus for evaporating bulk materials—elemental or compound—to form a thin film on a moving substrate. The evaporation source consists of: 1) an evaporation chamber 18, 2) two or more effusion nozzles 36 which direct the evaporating material from the evaporation chamber 18 towards the substrate 26, and optionally, 3) an expansion chamber interposed between the evaporation chamber 18 and effusion nozzles 36.

The high temperature of the surface of the evaporation material within the evaporation chamber 18 generates a vapor pressure above the surface that drives the vapor through the nozzles 36 toward the substrate 26 where it condenses to form the desired film. To achieve both deposition uniformity and high utilization of the evaporating material, it is necessary to properly position multiple effusion nozzles across the substrate width. To avoid an excessive number of sensors and heating elements, it is desirable to feed these nozzles from a single evaporation chamber.

This type of source is currently in use in both research and commercial environments. The present invention improves multiple-nozzle evaporation sources currently in use by: 1) the incorporation of tapered nozzles 36 for the purpose of reducing the thermal gradients along them and thus improving their performance, and 2) design of the evaporation chamber and/or expansion chamber to ensure uniform vapor pressure in the evaporation chamber.

The commercial visibility of thin-film solar modules requires large-area deposition techniques. One of these techniques is roll coating by thermal evaporation, in which a semiconductor film is deposited on a wide (>6"), flexible substrate that is continuously drawn over an array of thermal evaporation sources. An example of this is the deposition of Cu $(In_{1-x}Ga_x)$ $Se_2$ based semiconductor thin films where Cu, In and Ga are evaporated from sources described herein.

Evaporation sources require a significant quantity of heat shielding to reduce radiative heat losses. The effusion nozzles are the only elements of the source that are not covered by heat shielding. To prevent condensation of the effusing material on the heat shielding above the nozzle exit, it is necessary to prevent line-of-sight from the interior nozzle walls to the heat shielding. This is achieved in the existing art using a configuration shown in FIG. 1. The nozzle tip necessarily extends beyond the outermost surface of the heat shielding 22.

The configuration as shown in FIG. 1 is satisfactory at sufficiently low temperatures, i.e. low deposition rates. At high temperatures, however, the radiative losses from the nozzle annulus become significant. This results in a large enough temperature drop along the nozzle to cause condensation of the effusing material. This condensation causes a number of problems. First, the presence of condensation has been shown to correlate with the ejection of droplets of the source material. These droplets can deposit on the substrate causing electrical shorts. Second, the condensation of vapor on the nozzle walls reduces flow through the nozzle and alters the angular distribution of the effusion vapor. These can lead to non-uniform deposition reducing product performance and yield. Furthermore, under these circumstances, process controllability will be practically impossible.

One aspect of the present invention is an improved nozzle design that significantly increases the thermal conductance along the nozzle length, thereby reducing the temperature drop and reducing or eliminating condensation of the effusing material. By modifying the nozzle exterior to a conical profile 37, shown in FIGS. 2 and 2C–E, the solid cross-section is substantially increased while maintaining a small annulus for radiative losses. This increases the thermal conductance of the nozzle while maintaining the same radiative losses as a cylindrical exterior profile, thereby reducing the temperature gradient. This in turn substantially reduces or eliminates the nozzle condensation, and spitting thereby providing for reliable operation and control of the effusion source. Two presentations made on this subject are disclosed herein for further analysis of the problem and the description of the solution that is one of the subjects of the present invention.

Another aspect of the invention relating to the nozzle design is to coat a thermally conductive material 38 with a low-emissivity material, an example being coating a graphite nozzle with pyrolytic boron nitride. Graphite is more thermally conductive than boron nitride, while boron nitride has a lower emissivity than graphite. See FIG. 2D. Boron-nitride-coated graphite provides high thermal conductivity with low emissivity, further reducing nozzle temperature gradients.

An aspect of the invention relates to the equilibration of the temperature and vapor pressure within the evaporation source. Inline evaporation sources utilize a long, thin geometry to allow for wide-area deposition onto moving substrates. This is not an ideal geometry for heat transfer and convection within the source. Thermal non-uniformities along the source length give rise to variations in the vapor pressure. These variations result in non-uniform effusion from the nozzles, which in turn result in non-uniform deposition at the substrate. In order to maintain uniform deposition at the substrate, it is necessary to improve the internal thermal and pressure equilibration of the evaporation source.

There are two methods of improving the lateral equilibration within the evaporation source 30. In the first method the source is designed and operated in such a way that there is a large enough volume above the evaporant to increase the lateral vapor flow driven by vapor pressure variations caused by thermal gradients. This increased vapor flow directly aids pressure equilibration, and indirectly aids thermal equilibration by transferring latent heat from the hotter melt regions to the cooler melt regions. The second method is to interpose an expansion chamber between the evaporation chamber 18 and the effusion nozzles 36. See FIG. 2A where the expansion chamber 40 is schematically illustrated. In this method, the flow from the evaporation chamber to the expansion chamber is restricted, as is the flow from the expansion chamber through the nozzles. The expansion chamber possesses a high lateral vapor flow conductance, so that the lateral pressure profile underneath the effusion nozzles can equilibrate, thereby allowing consistent flow through the effusion nozzles. In this situation, only pressure equilibration occurs in the expansion chamber. There is no direct mechanism for thermal equilibration as in the previous method.

One use of the invention is the deposition of Cu(In$_{1-x}$Ga$_x$)Se$_2$ based semiconductor thin films on large area moving substrates whether solid or flexible web. In general, however, the invention can be used for the Physical Vapor Deposition of any type of materials on large area moving substrates (rigid or flexible web).

FIGS. 2B–2E compares three nozzle shapes. Type 1 in FIG. 2B is a straight nozzle 20 similar to that shown in FIG. 1. Nozzle 20 includes a lid 28 over evaporation chamber 18. Types 2 and 3 are tapered nozzles 36,36,36A in accordance with this invention. Each nozzle includes a lid 34 over evaporation chamber 18. Type 3 nozzle 36A differs from Type 2 nozzle 36 in that Type 3 has an internal taper 42. This would result in approximately 33% reduction in length with similar changes in temperature and could reduce the hypothetical wall condensate drip-down. Preferably, the tapered nozzle has a length to diameter ratio of 1.7. Thus, for example, where the length of the nozzle is 0.64 inches, the internal diameter would be 0.38 inches.

What is claimed is:

1. In a multiple nozzle thermal evaporation source having a containment box with an evaporation chamber and a heater and having heat shielding and having a plurality of effusion nozzles, the improvement being in that the exterior of the nozzles have a tapered shape to increase the thermal conductance of the nozzles and reduce the temperature gradient.

2. The source of claim 1 wherein the tapered shape is coated with a thermally conductive material with a low-emissivity material.

3. A source of claim 2 wherein the nozzles are made of graphite, and the thermally conductive material is pyrolytic boron nitrile.

4. The source of claim 1 including an expansion chamber interposed between the evaporation chamber and the effusion nozzles.

5. The source of claim 1 wherein the nozzles have an internal taper.

6. The source of claim 1 wherein the source has sufficient volume above the evaporant to increase the lateral vapor flow driven by vapor pressure variations caused by thermal gradients.

7. The source of claim 1 including a flexible substrate moving over the source, and the nozzles being positioned across the width of the substrate.

8. The source of claim 7 wherein all of the nozzles are fed from a single evaporation chamber.

9. The source of claim 7 in combination with further sources to create an array of thermal evaporation sources, and the substrate being continuously drawn over the array of sources.

10. The source of claim 1 wherein the nozzles are the sole elements of the thermal evaporation source not covered by heat shielding.

11. In a method of evaporating bulk materials for depositing semiconductor thin films on a moving substrate wherein the substrate is moved over a multiple nozzle thermal evaporation source having a containment box with an evaporation chamber and a heater and with the thermal evaporation source having heat shielding and having a plurality of effusion nozzles directed toward the surface of the moving substrate, the improvement being in increasing the thermal conductance of the nozzles and reducing the temperature gradient by using nozzles which have a tapered exterior shape.

12. The method of claim 11 including maintaining uniform vapor pressure in the evaporation chamber.

13. The method of claim 11 wherein the substrate is continuously drawn over an array of the thermal evaporation sources.

14. The method of claim 11 wherein Cu(In$_{1-x}$Ga$_x$)Se$_2$ based semiconductor thin films are deposited on large area moving substrates.

15. The method of claim 11 including coating the tapered exterior shape of the nozzles with a thermally conductive material with a low emissivity material.

16. The method of claim 11 including interposing an expansion chamber between the evaporation chamber and the nozzles.

17. The method of claim 11 including positioning the nozzles across the width of the continuous moving flexible substrate.

18. The method of claim 11 including feeding the nozzles from a single evaporation chamber.

* * * * *